United States Patent [19]

Chiao

[11] 4,372,033
[45] Feb. 8, 1983

[54] METHOD OF MAKING COPLANAR MOS IC STRUCTURES

[75] Inventor: Samuel Y. Chiao, West Carrollton, Ohio

[73] Assignee: NCR Corporation, Dayton, Ohio

[21] Appl. No.: 300,318

[22] Filed: Sep. 8, 1981

[51] Int. Cl.$^3$ .......................................... H01L 21/265
[52] U.S. Cl. .................................. 29/571; 29/576 B; 29/579; 29/580; 148/187; 427/94
[58] Field of Search ..................... 29/571, 576 B, 579, 29/580; 148/1.5, 187; 427/94

[56] References Cited

U.S. PATENT DOCUMENTS

| | | | |
|---|---|---|---|
| 3,755,001 | 8/1973 | Kooi et al. | 148/1.5 X |
| 3,852,104 | 12/1974 | Kooi et al. | 148/187 X |
| 3,900,350 | 8/1975 | Appels et al. | |
| 3,958,040 | 5/1976 | Webb | |
| 3,961,999 | 6/1976 | Antipov | |
| 3,966,501 | 6/1976 | Nomura et al. | 148/1.5 |
| 4,098,618 | 7/1978 | Crowder et al. | |
| 4,243,435 | 1/1981 | Barile | 148/1.5 |
| 4,251,571 | 2/1981 | Garbarino et al. | 29/571 X |
| 4,271,583 | 6/1981 | Kahng et al. | 29/571 |

*Primary Examiner*—G. Ozaki
*Attorney, Agent, or Firm*—J. T. Cavender; Philip A. Dalton; T. Rao Coca

[57] ABSTRACT

A method of forming planar silicon structures having recessed dielectric isolation oxide regions in which the bird's beak and bird's head associated with the silicon dioxide-silicon nitride dual mask are eliminated. After forming the pad oxide-nitride dual mask, photoresist is used for patterning the active device area and creating a photoresist overhang. Arsenic ions are then implanted and diffused in the isolation regions. Then, using a low (700°–800° C.) temperature wet oxidation, the doped silicon is fully converted to silicon dioxide forming a standard planar structure.

A true coplanar structure is obtained by continuing the process by etching the grown oxide and causing the nitride mask to overhang the pad oxide. Then, arsenic ions of a lower energy than before are implanted and diffused in the field regions, which regions are subsequently oxidized at the same low temperature as before forming the final planar structure having completely inset oxide regions.

A second embodiment for forming a true coplanar structure, follows the above described steps to the first oxidation. During the first oxidation only a part of the doped silicon is converted to silicon dioxide. The oxide is, thereafter, etched. Next, the remainder of the doped silicon is oxidized, forming the final intended structure.

14 Claims, 14 Drawing Figures

METHOD OF MAKING COPLANAR MOS IC STRUCTURES

BACKGROUND OF THE INVENTION

The invention relates to the fabrication of semiconductor devices with recessed oxide regions and, more particularly, to a method of forming coplanar integrated circuit structures having recessed oxide regions.

It is well-known that in the fabrication of integrated circuits, dielectric isolation between devices is achieved by forming recessed oxide regions extending into the silicon substrate from the surface. These thick oxide regions are delineated by using a silicon dioxide-silicon nitride composite mask. In such recessed oxide formation, the silicon dioxide-silicon nitride mask is first used as an etch barrier while recesses are etched through the mask openings in the silicon substrate and is then used as an oxidation mask during thermal oxidation of recessed isolation oxide regions.

One of the problems associated with the above technique of achieving dielectric isolation is that on growing the thick oxide region a conspicuous thin protuberance also grows underneath the silicon nitride oxidation mask. The protuberance is usually called a bird's beak. Associated with the bird's beak is the bird's head, an undesirable bump in the order of 4,000-5,000 Angstroms in height formed in the edge of the thick oxide layer adjoining the dual mask.

Typically, the bird's beak is formed in the recessed oxide during oxidation and results from lateral diffusion underneath the silicon dioxide (also known as pad oxide) which is formed between the silicon substrate and the silicon nitride. The bird's head results from the higher specific volume of the silicon dioxide than silicon and the lateral oxidation which occurs at the sidewalls of the recess. The silicon dioxide pad is used to prevent damage to the underlying silicon substrate by minimizing the stresses created on the substrate by the silicon nitride-silicon interface. Such stresses induce dislocations in the silicon substrate which result in undesirable leakage current channels and otherwise have a deleterious effect on the electrical characteristics of the interface. In other words, the use of the silicon dioxide pad to prevent damage to the underlying substrate results in the undesirable bird's beak and bird's head.

The existence of the bird's beak or bird's head incurs many disadvantages. The device active area is reduced and the field isolation area is increased by the bird's beak. This is disadvantageous since chip real estate, particularly in very large scale integrated circuits, is at a premium. Because of the bird's beak, it is difficult to achieve well-defined lateral isolation boundaries. Because of the abrupt inclinations of the recessed oxide due to the bird's head, electrode interconnections formed on the recessed oxide regions are prone to be fractured and disconnected. Another disadvantage of having the bird's head is that the close contact with a mask pattern necessary for photolithographic processing is difficult to achieve.

The foregoing are representative of the numerous disadvantages associated with the bird's beak and bird's head. It is, thus, readily apparent that it is desirable to reduce or eliminate the bird's beak and bird's head.

The publications, "Local Oxidation of Silicon: New Technology Aspects" by J. A. Appels et al., Philips Research Report 26, pages 157-165, June, 1971 and "Selective Oxidation of Silicon and its Device Application", E. Kooi et al., *Semiconductor Silicon*, 1973, published by Electrochemical Society, edited by H. R. Huff and R. R. Burgess, pages 860-879, are representative of the recognition in the prior art of the bird's beak and bird's head problems associated with silicon dioxide-silicon nitride composite masks when used in the formation of recessed silicon dioxide by thermal oxidation. The Appels et al. publication also concerns the bird's beak and bird's head problems associated with a nitride mask alone.

Attempts have been made in the prior art to reduce the bird's beak. For example, U.S. Pat. No. 3,900,350, issued Aug. 18, 1975, to Appels et al. teaches an approach to reducing the bird's beak by using a polysilicon layer under the silicon nitride mask instead of the silicon dioxode.

U.S. Pat. No. 3,961,999 issued June 8, 1976, to Antipov also describes a method for minimizing the bird's beak problem. In this patent, the conventional silicon dioxide pad is formed between the silicon substrate and the silicon nitride layer. The method disclosed in this patent involves etching openings through the silicon dioxide corresponding to the openings in the nitride to enable the undercutting and exposure of the underside of the silicon nitride at the periphery of the openings. A layer of silicon is then deposited in the recesses covering the undercut portions of the nitride followed by thermal oxidation of the deposited silicon to form the recessed oxide regions.

U.S. Pat. No. 4,098,618 issued July 4, 1978, to Crowder et al. attempts to solve the bird's beak problem by eliminating the intermediate pad oxide between the nitride mask and the substrate. The technique taught in this patent involves initially damaging the surface of the silicon substrate by ion implantation to a controlled depth and then annealing to generate a dense dislocation network array layer which prevents the stress induced defect propagation from the nitride mask. The nitride oxidation mask is then directly applied on the resultant substrate surface and patterned to define the recessed oxide regions. Thereafter, the recessed oxide is formed.

Despite the improvements in suppressing the bird's beak and/or bird's head exemplified by the above patents, there is need for further improvement in achieving well-defined dielectric isolation, particularly in view of the stringent requirements of the ever-demanding design rules in microelectronics industry.

SUMMARY OF THE INVENTION

The present invention uses the conventional oxide-nitride mask to form the recessed oxide, yet significantly reduces both the bird's beak and bird's head. This is accomplished by first doping the areas of the substrate where the recessed oxide is to be formed while protecting, with the aid of an overhang mask, the areas where bird's beak or bird's head is generally formed. Then, using the phenomenon that doped silicon oxidizes at low temperatures at a faster rate than undoped silicon, the oxide is grown profusely in the doped regions while minimizing oxide growth in the regions where the bird's beak or bird's head are formed.

By using this process, it is possible not only to form a standard coplanar semiconductor integrated circuit structure having recessed isolation oxide regions which project above the substrate surface but also a true coplanar structure having recessed isolation oxide regions completely set inside the substrate such that the upper surface of the resulting structure is planar. A structure of the latter type would be most desirable since it would eliminate the breakage of polysilicon or metal interconnections used in integrated circuits due to stresses created in the interconnections by changes in volume in the supporting semiconductor material during the integrated circuit fabrication heating steps. A field oxide fully recessed into the substrate also allows minimum spacing between diffusions thereby conserving chip real estate.

In accordance with the method of the present invention, first an oxide (also called pad oxide herein)-nitride mask is formed on a silicon substrate. Then, covering the active area with a photoresist mask, the nitride is etched such that the photoresist overhangs the nitride a predetermined distance. Next, ions of a predetermined dose and energy are implanted in the regions of the substrate not protected by the photoresist mask. The photoresist is then removed and the implanted ions are diffused into the substrate. Thereafter, using a 700°–800° C. temperature of oxidation a thick oxide is grown in the doped regions completely leaking out the ions. The pad oxide and the nitride are then removed obtaining a standard coplanar structure.

A true coplanar structure is obtained by continuing the above process. After growing the thick oxide, it is etched forming a mesa of silicon, oxide and nitride in which the nitride slightly overhangs the oxide. Next, a second ion implantation in the regions of the substrate not protected by the nitride mask followed by a diffusion is accomplished. Thereafter, by using low temperature oxidation, as previously explained, the recessed oxide regions are grown until the top surface of these regions matches the height of the semiconductor substrate regions. The pad oxide and the nitride are then removed.

Since the regions of the substrate where the bird's beak and bird's head are formed are protected by the photoresist and nitride overhangs during the first and second implantations, respectively, little oxidation of these substrate regions occurs, thereby minimizing the bird's beak and bird's head growth therein.

An alternative method of forming a true coplanar structure is obtained by modifying the above process for a standard coplanar structure to eliminate the second implantation. After implantation in the field region, the ions are diffused into the substrate to a relatively great junction depth. Thereafter, by using the previously described low temperature oxidation, a thick oxide is grown converting only a part of the doped silicon to silicon dioxide. The grown oxide is then etched forming a mesa of silicon-oxide-nitride. Finally, a second low temperature oxidation is accomplished fully converting the remainder of the doped silicon in the field regions of the substrate to silicon dioxide.

BRIEF DESCRIPTION OF THE DRAWINGS

FIGS. 1, 2, 3A, 5A, 6A and 7 are cross-sectional representations of forming a true coplanar structure using an alternative process of the present invention.

FIGS. 1–5 and 8 are cross-sectional representations of the sequential stages of fabricating a standard coplanar semiconductor structure using a process of the present invention.

FIGS. 1–5, 6B, and 9 are cross-sectional representations of the sequential stages of forming a true coplanar semiconductor structure having a bird's beak and/or bird's head using a modified process of the present invention.

DETAILED DESCRIPTION

Figure 1:
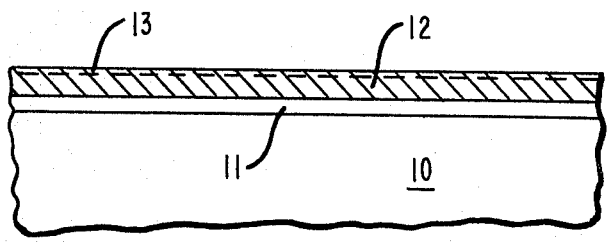
FIGS. 1–7 are cross-sectional representations of the sequential stages of fabricating a true coplanar semiconductor structure using the processes of the present invention.

The invention will now be described, by way of examples, with reference to the accompanying drawings. Table I is an outline of the process sequence for forming a standard coplanar structure having a reduced bird's beak and bird's head in accordance with the present invention. In Table I, Steps 1 to 8 and 13 refer to the standard coplanar structure and steps 1 to 13 refer to the true coplanar structure. While the following description is primarily directed toward the farication of the standard and true coplanar integrated circuit structures, this description is exemplary of the fabrication of a class of integrated circuit structures which embody the principles of the present invention. In addition, it should be noted that although the thickness and other dimensions shown in the drawings herein are selected for clarity of ilustration and not to be interpreted in a limiting sense there are a number of parameters whose dimensions are critical to practice this invention.

TABLE I

Process Flowchart for Standard/True Coplanar Structure

Steps 1–8 and 13 Standard Coplanar

Steps 1–13 True Coplanar

Figure 7:
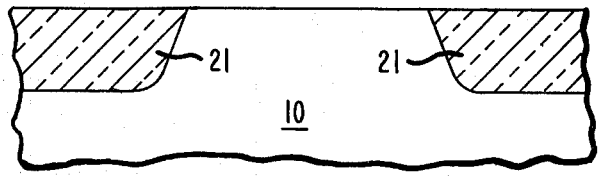
Figure 8:
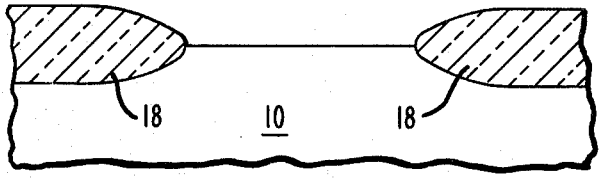

1. Starting material: (111) or (100) Si
2. Pad oxide formation (FIG. 1)
3. Nitride deposition (FIG. 1)
4. Thin oxide formation (optional) (FIG. 1)
5. Patterning active region (FIG. 2)
6. High energy arsenic ion implantation (FIG. 3)
7. Arsenic diffusion in field regions (FIG. 4)
8. Low temperature field oxidation fully converting doped silicon to silicon dioxide (FIG. 5)
9. Etching the oxide of step 8 forming a silicon-oxide-nitride mesa (FIG. 6)
10. Low energy arsenic ion implantation (FIG. 6)
11. Arsenic diffusion in field regions (FIG. 6)
12. Low temperature field oxidation fully converting silicon doped in step 10 to silicon dioxide (FIG. 7)
13. Removal of oxide-nitride dual mask (FIGS. 7 or 8)

Standard Coplanar Structure

The starting material is a slice of n-type or p-type monocrystalline semiconductor grade silicon. The starting material can be of either (111) or (100) orientation and has a bulk resistivity typically of 8–12 ohm-centimeter. In the Figures, the substrate 10 represents only a very small undivided part of the slice, perhaps 1 mil wide for each part. After appropriate cleaning, the slice is oxidized (step 2) by exposing, typically, to pure, dry oxygen at a rate of 5 liters per minute in a furnace tube at an elevated temperature of perhaps 850°–1000° C. to produce an oxide layer 11 (FIG. 1) over the entire slice to a thickness of about 100-500 Angstroms. The thermal oxidation may be accomplished at atmospheric pressure or at a high pressure of up to 7 atmospheres. The oxide layer 11 (also referred to herein as pad oxide) may also be formed by wet oxidation by passing oxygen gas through water maintained at 97° C., at the same flow rate as before, prior to admitting the oxygen into the furnace tube. The temperature of wet oxidation is also in the range of 850°-1000° C.

After oxidation, as illustrated in FIG. 1, a silicon nitride layer 12 is deposited (step 3) on the silicon slice, by low pressure chemical vapor deposition (LPCVD) using a mixture of ammonia and dichlorosilane at a temperature of about 700° C. and a pressure of 400 millitorr. A typical ratio of ammonia to dichlorosilane is 3.5:1. The thickness of nitride 12 formed in this manner is typically in the range of 700-1800 Angstroms. The lower limit here corresponds to the minimum thickness of the nitride needed to avoid defects in the nitride through which unwanted oxygen penetration may occur at a subsequent stage of fabrication of the present device. Beyond 1800 Angstroms the nitride 12 may strain the surface of the silicon substrate 10 to a degree that the substrate surface will develop dislocations and defects resulting in unwanted junction leakage.

Next, in order to increase the adhesion of the next to be deposited photoresist layer to the nitride layer 12, the surface portion of the nitride layer may be oxidized (step 4) to form a thin surface layer 13 (FIG. 1) of silicon dioxide. This may be done by treating the nitride 12 with steam at 750°-1000° C. or by LPCVD at a temperature of 400°-500° C. for a time sufficient to form a silicon dioxide layer 13 of about 50-100 Angstroms thickness. Although this step is not essential to the concept of the present invention per se, it is believed preferable to use this step to enhance adhesion of the nitride 12 to the next to be formed photoresist layer.

Figure 2:
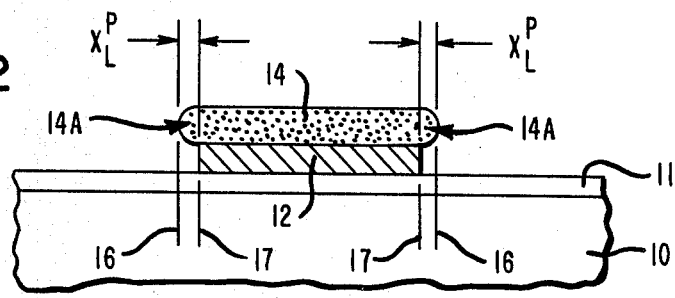

Next, as shown in FIG. 2, a layer of photoresist 14 of typical thickness in the range 6,000-10,000 Angstroms is applied over the entire surface of the resulting structure using a conventional process, then exposed to ultraviolet light through a mask which defines the desired pattern of the device active area. The photoresist is then developed by using a suitable solvent exposing the areas where the nitride is to be etched away. Before etching the nitride, if the thin layer 13 of oxide was formed on the nitride 12, then this thin oxide layer is removed by dipping the slice in a dilute hydrofluoric acid solution. The nitride layer 12 is then etched (step 5) using the overlying photoresist 14 (FIG. 2) as a mask by a conventional etching technique such as plasma etch or a wet chemical etch.

The nitride etch discussed in the previous step is accomplished in a controlled manner such that the nitride 12 is undercut resulting in a critical overhang 14A of length $X_L^p$ of the photoresist 14 past the edge of the nitride 12 as shown in FIG. 2. The length of the overhang $X_L^p$ is the distance between edge 16 of the photoresist overhang 14A and edge 17 of the nitride mask 12. This photoresist overhang 14A is necessary to protect the regions of the substrate directly beneath the nitride-oxide dual mask from being doped in the next to follow ion implantation step of the present process as fully explained hereinbelow. The length $X_L^p$ of the overhang chosen for reducing the bird's beak and bird's head is a function of such parameters as the ion implantation energy, dose and drive-in depth which will become meaningful subsequently.

Figure 3:
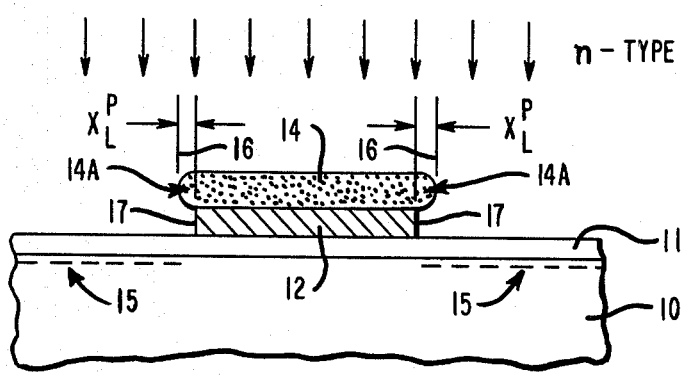

After patterning the active region in the manner described above, as shown in FIG. 3, the structure is subjected to a conventional ion implantation step (step 6) whereby, for example, arsenic ions of a high energy in the rage 80-100 Kev and dose $8 \times 10^{15}$ ions per square centimeter are introduced into the unmasked regions of the substrate through the oxide layer 11. Other suitable dopants include phosphorus. The profile of the dopant following this implantation step is shown in FIG. 3 by numeral 15. During this doping step, the areas of the substrate where the bird's beak and bird's head are generally formed, namely, the areas of the substrate directly beneath the photoresist overhang 14A and between the boundary lines 16 and 17, are protected by the photoresist overhang 14A and thus are not doped.

Figure 4:
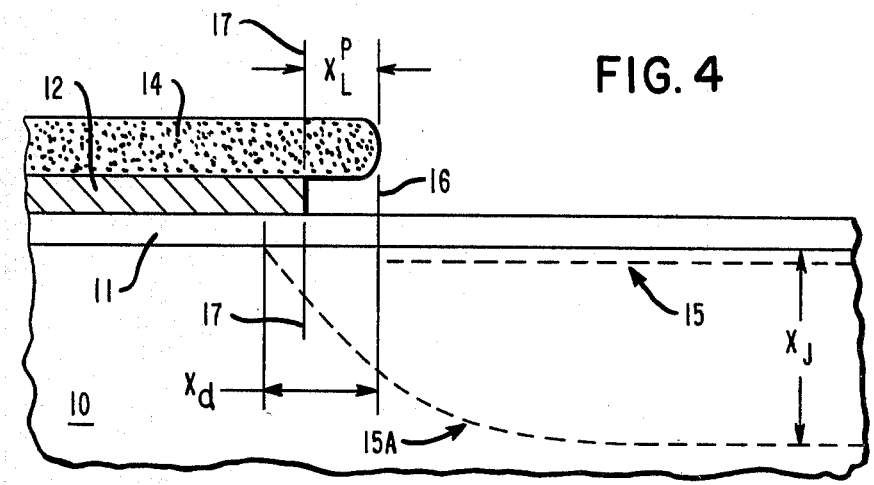

Next, the photoresist 14 is removed and the implanted arsenic ions are diffused (step 7) into the substrate to a predetermined junction depth $X_J$ as shown in FIG. 4, which is an enlarged illustration of a section of the structure shown in FIG. 3, using a conventional diffusion process. The profile of the dopant following the diffusion step is shown in FIG. 4 by numeral 15A. The junction depth $X_j$ is determined by the thickness $t_{ox}$ of the recessed isolation oxide. The thicker the isolation oxide needed, the greater the depth $X_j$. Typically, the thickness of the doped silicon consumed during oxidation (step 8) is about 50% of the silicon dioxide grown therefrom, or $$X_j = 0.5 t_{ox}. \tag{1}$$

For example, for growing a 10,000 Angstrom thick isolation oxide, the ions are diffused preferably to a depth $X_j$ of about 0.5 microns. To diffuse arsenic ions to a depth $X_j$ of 0.5 microns, the implanted structure is subjected to a temperature of 1000° C. in a nitrogen atmosphere for about 120 minutes. During this diffusion step, the arsenic ions diffuse not only in the vertically downward direction but also laterally. The sideways diffusion distance $X_d$, which is measured from the boundary line corresponding to the edge 17 of the overhang 14A (FIG. 4) is a function of the dopant dose and is generally less than the vertical diffusion distance $X_j$. For a dose $D_1$ of $8 \times 10^{15}$ ions/cm$^2$, $X_d$ is about 70% of the vertical diffusion or $$X_d = 0.7 X_j. \tag{2}$$

In other words, if the arsenic is to be diffused downward into the substrate to a depth $X_J$ of 0.5 microns, the corresponding sideways diffusion distance $X_d$ would be about 0.35 microns. When a smaller dose of arsenic ions is used, the sideways diffusion distance $X_d$ would, of course, be less. For example, for a dose $D_2$ of about $10^{15}$ ions per square centimeter, the sideways diffusion would be only about 50% of the vertical diffusion or $$X_d = 0.5 X_j. \tag{3}$$

Combining equations (1) and (2), a direct relationship between $X_d$ and $t_{ox}$ for an ion dose $D_1$ is obtained as $$X_d = 0.35 t_{ox}. \tag{4}$$

The corresponding relation for the lower ion dose $D_2$, which is obtained by combining equations (1) and (3) is $$X_d = 0.25 t_{ox}. \tag{5}$$

Thus, for the exemplary ion dose of $8 \times 10^{15}$ ions/cm² and oxide thicknesses of 10,000 Angstroms (1 micron) and 13,000 Angstroms (1.3 microns), the lateral diffusion distance would be 0.35 microns and 0.45 microns, respectively. For the lower dose of $1 \times 10^{15}$ ions/cm², the lateral diffusion distance corresponding to the isolation oxide thickness of 10,000 Angstroms (1 micron) and 13,000 Angstroms (1.3 microns) are, respectively, 0.25 microns and 0.32 microns.

The length $X_L^p$ of the overhang 14A is arranged preferably to be somewhat less than the lateral diffusion distance $X_d$. When $X_L^p$ is less than $X_d$, the area of the substrate directly beneath the nitride is not doped during the implantation step (step 6), although the areas of the substrate beneath the nitride 12 and interior to the nitride boundary 17—17 may be doped during the diffusion step (step 7). However, the doping in the regions just mentioned is light compared to that in the regions outside the boundary 17—17, providing rapid oxidation outside the boundary 17—17 and slower oxidation beneath the nitride 12 during the next-to-follow oxidation step (step 8) thereby substantially eliminating the bird's beak and bird's head. When $X_L^p$ is equal to or greater than $X_d$, the substrate area directly beneath the nitride 12 is not doped during either the implantation step (step 6) or the diffusion step (step 7). This provides rapid oxidation outside the nitride boundary 17—17 and slower oxidation beneath the nitride 12 and thereby eliminates the bird's beak and bird's head. However, in all these three situations there may result, due to an excessive over-etching of the nitride 12, a nitride-edge which will be ragged and/or ill-defined. Such an improperly cut nitride mask will imprecisely define the active region causing design rule errors in subsequent device fabrication. At any rate, it has been found that excellent bird's beak and bird's head suppression is obtained for the exemplary parameters such as $D_1 = 8 \times 10^{15}$ ion/cm², $t_{ox} = 10,000$ Angstroms, $X_j = 0.5$ microns, $X_d = 0.35$ microns when $X_L^p$ was in the range of (0.1-0.2) microns.

Following the diffusion of the arsenic ions to the desired junction depth, a low temperature steam oxidation is accomplished (step 8) to grow the thick field oxide regions 18 (FIG. 5) in the doped areas 15—15 (FIG. 4) of the substrate by consuming the silicon therein. The temperature selected for this oxidation step is in the range 700°–800° C. and the time of oxidation is about 15-24 hours depending on the thickness of the field oxide regions 18 desired. During this low temperature oxidation step, oxidation of the undoped regions of the substrate will be minimal thereby suppressing the bird's beak and bird's head. The suppression of bird's beak and bird's head is achieved because silicon dioxide has different growth rates depending upon the silicon surface on which it is formed. The growth rate of silicon dioxide from the highly doped silicon region 15—15 is significantly greater than that of the intrinsic or undoped silicon corresponding to the nitride mask 12. The growth rate is a function of the crystal orientation of the doped silicon surface, the rate for (111) surface being about 10-20% higher than that for a (100) surface and also the energy and dose of the ions used for doping (if accomplished by ion implantation) the silicon. For example, when arsenic ions of 100 keV energy and $8 \times 10^{15}$ ions per square centimeter dose are used to dope a (100) silicon, the oxide growth rate in the doped regions at the low temperature of 750° C. is about 5-6 times higher than in the undoped regions of the same material. In general, the oxide growth rate increases as the impurity concentration increases. The difference in oxidation rate between doped and undoped silicon also increases as the oxidation temperature becomes lower. Hence a lower temperature is more advantageous for the performance of this invention. However, when the temperature for thermal oxidation is excessively low, the period of time required for the oxidation is too long which creates a problem from the industrial point of view of requiring a round-the-clock attention. In practice, the temperature for the thermal oxidation in accordance with this invention, as already mentioned, lies between 700° C. and 800° C. when the ambient pressure is about one atmosphere since under these conditions it is possible to grow a 10,000-12,000 Angstrom thick field isolation oxide within a more manageable time of about 15-24 hours. It is appreciated that the oxidation rate becomes greater with increasing ambient pressure and the oxidation time can be made shorter or the oxidation temperature may be lowered below 700° C. for a predetermined thickness.

Thus, in this invention, the substrate areas where bird's beak and bird's head are formed are protected from doping during the ion implantation step and the diffusion step by means of the photoresist overhang 14A and then, by conveniently employing the different growth rates of silicon dioxide in doped/undoped silicon, the growth of bird's beak and bird's head is considerably decreased.

The thickness of the field oxide regions 18 (FIG. 5) grown as explained above is typically in the range of 10,000-12,000 Angstroms. After growing the field oxide regions 18, the oxide-nitride dual mask 11-12 is removed in the usual manner by first dipping the structure in dilute hydrofluoric acid to remove any oxide film that is formed over the nitride 12 during the previous oxidation step, then subjecting the nitride to an etchant such as hot phosphoric acid or a plasma which removes the nitride but not the silicon dioxide, followed by a re-dipping in dilute hydrofluoric acid to remove the pad oxide 11. Thereafter, the exposed silicon is cleaned. The resulting structure is an improved standard coplanar structure, shown in FIG. 8, having a suppressed bird's beak and bird's head.

EXAMPLE 1

Standard Coplanar Structure

In a specific example of the process for forming a standard coplanar structure having about 10,000 Angstroms thick isolation oxide regions with a suppressed bird's beak and bird's head as exemplified by the process discussed above, after forming a 500 Angstrom thick pad oxide (11) and an 1800 Angstrom thick nitride (12) composite mask (steps 2 and 3) on an n-type silicon substrate, the active region was patterned (step 5) using a photoresist 14 of thickness of about 8,000 Angstroms. Then, the nitride 12 was etched from the field regions, simultaneously creating the photoresist overhang 14A of length $X_L^p$ in the range of about (0.1-0.2) microns. Next, arsenic ions of energy 100 keV and dose about $8 \times 10^{15}$ ions per square centimeter were implanted in the field regions (step 6). Thereafter, the arsenic ions were diffused into the silicon substrate to a depth of about 0.5 microns by subjecting the structure to a temperature of about 1000° C. for about two hours in a nitrogen environment (step 7). For the ion dose and energy, diffusion time and temperature chosen in this example, the sideways diffusion $X_d$ of arsenic was about 0.35 microns. Then, the doped field regions were oxidized at a temperature of about 750° C. for a period of about 20 hours, fully converting the doped silicon surface into a 10,000 Angstrom thick field oxide (step 8). The pad oxide 11 and nitride 12 were then removed (step 13).

True Coplanar Structure

Figure 5:
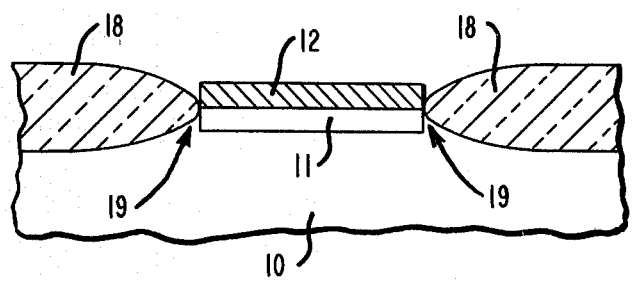

In order to form a true coplanar structure having recessed oxide regions fully set below the substrate surface, in an alternative method of practicing this invention, the above process described in connection with the standard coplanar structure and summarized in Table I may be continued in the following manner after the low temperature oxidation step (step 8, in Table I) in which doped regions of the substrate are fully converted into field isolation oxide regions 18 (FIG. 5). The complete sequence of steps (steps 1–13) of forming the true coplanar structure in accordance with this method is provided in flowchart form in Table I.

Figure 6:
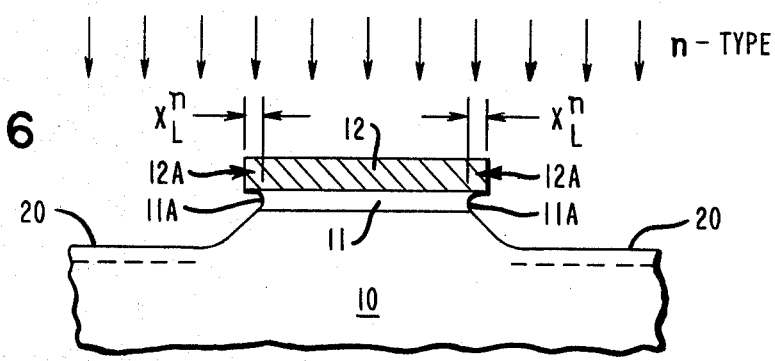

After step 8, the thick field oxide formation (FIG. 5) surface is subjected to dilute hydrofluoric acid etch (step 9) for about 6–7 minutes to remove the field oxide and thereby form a mesa of silicon (10)-silicon dioxide (11)-silicon nitride (12) as shown in FIG. 6. The oxide etch in this step not only removes substantially all the field oxide 18 forming the recesses 20 in the substrate, but also forms the nitride overhang 12A. As shown in FIG. 6, the nitride overhang 12A is tailored, by controlling the etch time in step 9, to have an overhang length $X_L^n$. The length $X_L^n$ of the overhang 12A is chosen such that the substrate regions beneath regions 11A of the pad oxide 11 where the bird's beak and bird's head are generally formed are protected from doping during the second field doping (steps 10 and 11) discussed below. This is analogous to the protection of substrate region beneath the nitride 12 and interior to the nitride boundary 17—17 (FIG. 3) during the previously described fabrication process of Table I, step 5. The length $X_L^n$, like the photoresist overhang length $X_L^p$ discussed in connection with step 5 above and for the reasons discussed therein, is arranged to be somewhat less than the lateral diffusion distance $X_d$ of the dopant at the completion of the diffusion step 11 discussed below. As discussed in connection with the photoresist overhang length $X_L^p$, the value of the nitride overhang length $X_L^n$ which is necessary to suppress the bird's beak and bird's head is also ultimately determined by the thickness of the final field isolation oxide. At any rate, it has been found that excellent bird's beak and bird's head suppression is obtained for the exemplary parameters such as the vertical drive-in depth $X_j$ (at the completion of step 10) of about 0.5 microns (which dimension is chosen to grow a 10,000 Angstrom thick final isolation oxide) and the lateral diffusion $X_d$ (at the completion of step 11) of about 0.35 microns when $X_L^n$ is about (0.1–0.2) microns.

Next, a dopant such as arsenic or phosphorus is ion implanted in the field regions (step 10). Arsenic ions of a relatively low energy in the range of 30–50 KeV and a dose preferably of the same value as in the first implantation (step 6, Table I) of $8 \times 10^{15}$ ions per square centimeter are used in this implantation step. Lower energy arsenic ions are selected for the present field doping step than those used in step 6, since now the photoresist layer 14 (FIGS. 2–4) is no longer present to protect the active region from high energy ion implantation. The energy selected in the present step, which is governed by the thickness of the nitride mask 12, is such that arsenic ions will not penetrate the nitride mask 12.

After the low energy ion implantation in the field regions, the structure is subjected to a high temperature diffusion (step 11) using the same conditions as explained in connection with step 7 above to diffuse the ions into the recesses 20 of the substrate.

Next, a low temperature oxidation (step 12), which can use the same conditions as those discussed above in connection with the first field oxidation (step 8) is achieved to grow the final field oxide regions 21 shown in FIG. 7. As explained previously, the novel combination of protecting the substrate regions beneath the pad oxide regions 11A from doping and oxidizing the structure at a low temperature substantially suppresses the bird's beak and bird's head formation. The low temperature oxidation of the present process step is continued for about 15–24 hours until the upper surface of the field isolation oxide regions matches the surface of the active region of the silicon substrate 10. Thereafter, the oxide-nitride composite mask 11–12 is removed (step 13) in a conventional manner as fully explained above in connection with the standard coplanar structure. The resulting structure as illustrated in FIG. 7 has a true coplanar surface with a plurality of recessed oxide isolation regions 21.

EXAMPLE 2

True Coplanar Structure

In a specific example of forming a true coplanar structure having a suppressed bird's beak and bird's head as exemplified by the process discussed immediately above, first steps 1 through 8 as described in Example 1 were accomplished. Then, the newly-grown oxide 18 (FIG. 5) was etched (step 9) using a conventional oxide etchant forming a mesa of silicon (10)-silicon dioxide (11)-silicon nitride (12) (FIG. 6) wherein the nitride 12 was tailored to overhang the pad oxide 11 to a distance of about 0.1 micron. The field regions, 20 (FIG. 6) were then ion implanted (step 10) by means of arsenic ions of energy of about 40 keV and dose about $8 \times 10^{15}$ ions per square centimeter. Thereafter, the arsenic ions were diffused into the substrate (step 11) using the same conditions explained above in connection with this Example 2 to a depth of about 0.5 microns. This particular junction facilitated growing a 10,000 Angstrom thick final isolation oxide 21 (FIG. 7). Following the diffusion of arsenic, a second low temperature oxidation (step 12) using the same conditions as explained above in connection with the present Example was accomplished growing the field oxide regions 21 (FIG. 7) until the upper surface of these oxide regions matched the active region of the silicon substrate. The oxide (11)-nitride (12) mask was then removed.

True Coplanar Structure (Alternative Process)

An alternative method of forming a true coplanar structure having a suppressed bird's beak and bird's head in accordance with the present invention is illustrated in a flowchart sequence in Table II, below. The steps of this alternative method are: after the high energy ion implantation (step 6) in the field regions, diffusing the ions into the substrate to a substantially greater depth than before (step 7'); partially converting (i.e., converting the upper portion of) the doped substrate to oxide (step 8') thereby leaving a residual amount of dopant in the substrate; and etching the oxide grown in step 8' (step 9'). The second implantation and diffusion steps (steps 10 and 11 Table I) are eliminated. Instead, the substrate areas where a residual dopant remained after the oxidation (step 8'), are reoxidized fully converting the doped silicon to oxide (step 10). Finally, the oxide-nitride mask is removed.

Table II

Figure 3A:
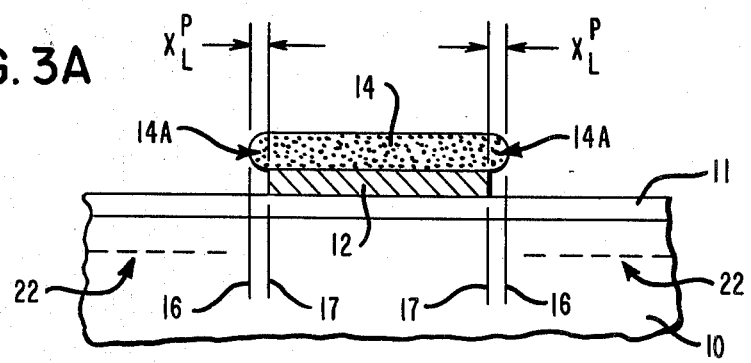

Alternative Process Flowchart for True Coplanar structure 1-6. Same as the corresponding steps in Table I.
7'. Deep arsenic diffusion (FIG. 3A)
8'. Low temperature field oxidation partially converting doped silicon to silicon dioxide (FIG. 5A)
9'. Etching the oxide grown in step 8 (FIG. 6A)
10'. Second low temperature oxidation fully converting doped silicon to silicon dioxide (FIG. 7)
11'. Removal of oxide-nitride dual mask (FIG. 7)

As illustrated in Table II, the sequence of steps in this method follows the sequence of the previous method of forming a true coplanar structure described above and illustrated in Table I through the step of ion implantation in the field regions (step 6, Table I). The energy and dose of ions used in this implantation step are the same as before, namely, when arsenic dopant is utilized, of about 80-100 keV and $8 \times 10^{15}$ ions per square centimeter, respectively. The arsenic diffusion (step 7') departs from the previous process in that after implantation, the arsenic ions are driven deep into the silicon material (FIG. 3A) in the areas where the field oxide is to be formed, e.g., using a temperature of 1000° C. in a nitrogen atmosphere for a period of 2.5-4 hours such that the junction depth is in the range of (0.7-1) microns. The lower limit corresponds to forming a recessed isolation oxide of thickness of about 10,000 Angstroms. The upper limit corresponds to an oxide thickness of about 13,000 Angstroms.

Figure 5A:
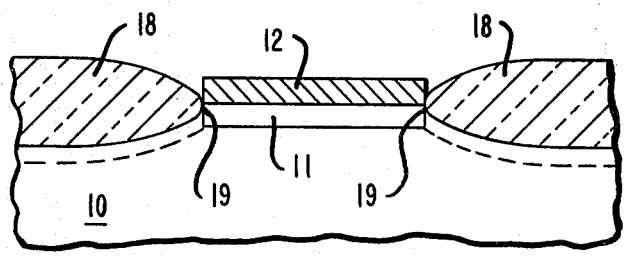

Thereafter, referring to FIG. 5A, a low temperature steam oxidation (step 8'), at a temperature in the range 700°-800° C. for about twenty-four hours is applied to partially convert the doped silicon to silicon dioxide, leave some arsenic dopant in the lower strata of substrate 10 where the dopant was introduced during the implantation and diffusion steps (steps 6 and 7', respectively). Specifically, during this oxidation step (step 8'), about half of the doped silicon is converted to silicon dioxide leaving behind in the substrate a doped layer of a thickness in the range of about (0.35-0.5) microns. The exact thickness of the doped silicon left after the oxidation step 8' is determined by the final isolation oxide thickness desired and the amount of silicon dioxide that is to be left behind after the next-to-follow etching step (step 9'). If during step 9, all of the grown oxides 18 (FIG. 5A) is to be removed, and if the desired final isolation oxide thickness is about 10,000 Angstroms, then a doped silicon of thickness of about 0.5 microns would be left beneath the oxide regions 18 (FIG. 5A) after the oxidation step (step 8'). If, on the other hand, after the etching step (step 9') about a 2,000 Angstrom thick layer of oxide 18 is to be left behind, and if the desired final isolation oxide is again about 10,000 Angstroms, then a doped silicon of thickness of about 0.4 microns is sufficient. The thickness of the oxide 18 (FIG. 5A) grown is typically in the range of 10,000-13,000 Angstroms.

Figure 6A:
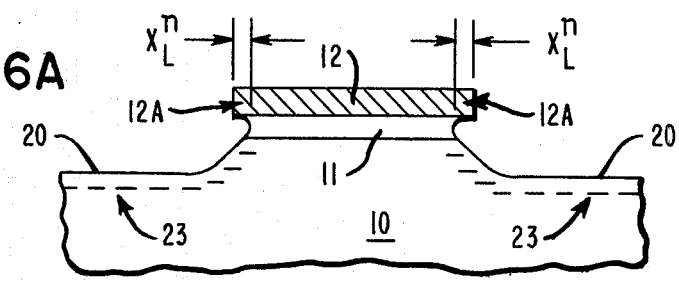
Figure 6B:
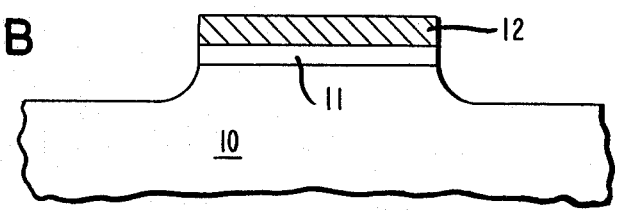

Next, the grown oxide 18 is etched (step 9') in a conventional manner resulting in the recesses 20 in the substrate and a silicon (10)-oxide (11)-nitride (12) mesa (FIG. 6A). During this etching step, the sidewalls 19 (FIG. 5A) of pad oxide 11 are also etched away, thus eliminating the presence of any possible arsenic that may have entered the sidewalls during the implantation. This etching step insures against possible oxide growth from the silicon near the sidewalls 19 (FIG. 5A) in the next-to-follow oxidation step. A significant difference of this alternative process of forming a true coplanar structure from the true coplanar process summarized in steps 1-13 of Table I is that in this process the second implantation and diffusion steps (steps 10 and 11, Table I, respectively) are eliminated. These steps are eliminated because at the completion of the etching step (step 9', Table II), the etched upper surfaces 23 (FIG. 6A) of the silicon in the locations where arsenic was introduced in the implantation-diffusion steps (steps 6 and 7) retain intact a residual arsenic discussed above. These surfaces 23 (FIG. 6A) of silicon are then oxidized at a low temperature of 750° C. for a period of 15-24 hours fully consuming the doped silicon and until the surface of the field oxide regions is coplanar with the active surface of the substrate 10.

EXAMPLE 3

True Coplanar Structure

In a specific example of the alternative process for forming a true coplanar structure having a suppressed bird's beak and bird's head as exemplified by the process discussed immediately above relative to Table II, the steps of Example 2 above through the step of arsenic diffusion (step 6) were carried out. After arsenic ion implantation (and removal of the photoresist 14), the arsenic ions were diffused at 1000° C. for about 2.5 hours such that the junction depth, (FIG. 3A) at the completion of this step was about 0.8 microns (step 7', Table II). Next, using a 750° C. temperature wet oxidation for about twenty-four hours, the thick oxide regions 18 (FIG. 5A) of thickness of about 9,000 Angstroms were grown converting about 0.4 microns thickness of the doped upper layer silicon in regions 22 (FIG. 3A) to silicon dioxide (step 8'). Thereafter, oxide 18 was etched (step 9') forming a silicon-oxide-nitride mesa (FIG. 6A). Next, a second low temperature oxidation, using the same conditions as before, was accomplished growing the final isolation oxide regions 21 of thickness of about 10,000 Angstroms (FIG. 7) while fully consuming the remaining 0.4 microns thick doped silicon material in regions 23 (FIG. 6A) (step 10'). Thereafter the oxide-nitride mask was removed (step 11').

Figure 9:
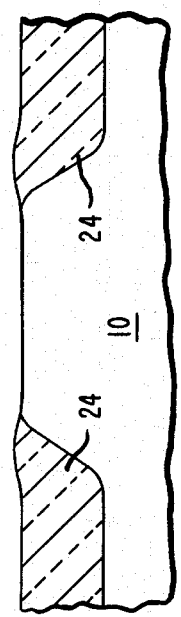

The above described process may be modified to construct a planar structure where suppression of bird's beak and bird's head is not a concern. This is achieved by following the process sequence shown in Table I through step 9, the step of etching the grown oxide and forming the mesa of silicon dioxide-nitride structure (FIG. 6). After this etching step, the structure is oxidized at a high temperature, in the range of 1000°-1100° C., growing the final field oxide regions such that the upper surfaces of these grown regions are coplanar with the active surface of the silicon 10. The high temperature oxidation has the advantage of forming a 10,000-13,000 Angstrom oxide 24 (FIG. 9) in about 7-10 hours as compared to the time of 15-24 hours formation time required for low temperature oxide 21

(FIG. 7). Since the just-mentioned oxidation is accomplished at a high temperature, and the silicon substrate where the field oxide is to be formed is no longer doped, the bird's beak and bird's head characteristics of prior art methods will be inherently formed near the pad oxide sidewalls. However, the final structure that results from this process shown in FIG. 9 will have the advantage of being substantially coplanar.

The present invention may also be conveniently extended to achieve another extremely important aspect of integrated circuits. This aspect is the provision of doping the silicon substrate beneath the field isolation oxide regions 18 (FIG. 8) or 21 (FIG. 7), often referred to as a parasitic channel stopper doping. Parasitic channel stopper doping is important for eliminating unwanted conduction due to inversion under the field isolation when undoped or lightly doped substrates are employed. The use of lightly doped substrates is practiced in order to reduce diffused line capacitance which degrades performance as well as reducing hot electron effects which degrade reliability.

When n-type parasitic channel stopper doping is to be provided, which is typically the case when p-channel field effect transistor devices are intended to be formed on the resulting structure, the present process is modified such that, for example, when arsenic is used to dope the field isolation oxide regions, the arsenic ion implantation energy, dose, drive-in temperature and time and the parameters associated with the final field oxidation step are so adjusted that after the completion of the field oxidation an adequate amount of arsenic is left behind to form an effective channel stop under the field oxide.

When p-type parasitic channel stopper doping, is to be provided, which is typically the case when n-channel field effect transistor devices are desired on the resulting structure, however, an initial boron implantation and drive-in will have to be accomplished before the arsenic implantation of step 6. The boron penetration depth is adjusted to be greater than the arsenic penetration depth such that after the final field oxidation step, fully leaking out the arsenic, boron is left beneath the thick oxide.

Utilizing the structures of FIGS. 7 or 8, the active devices of the integrated circuit may be completed using conventional integrated circuit fabrication techniques. These techniques, of course, include diffusion and/or ion implantation of regions of the coplanar structure.

Figure 10:
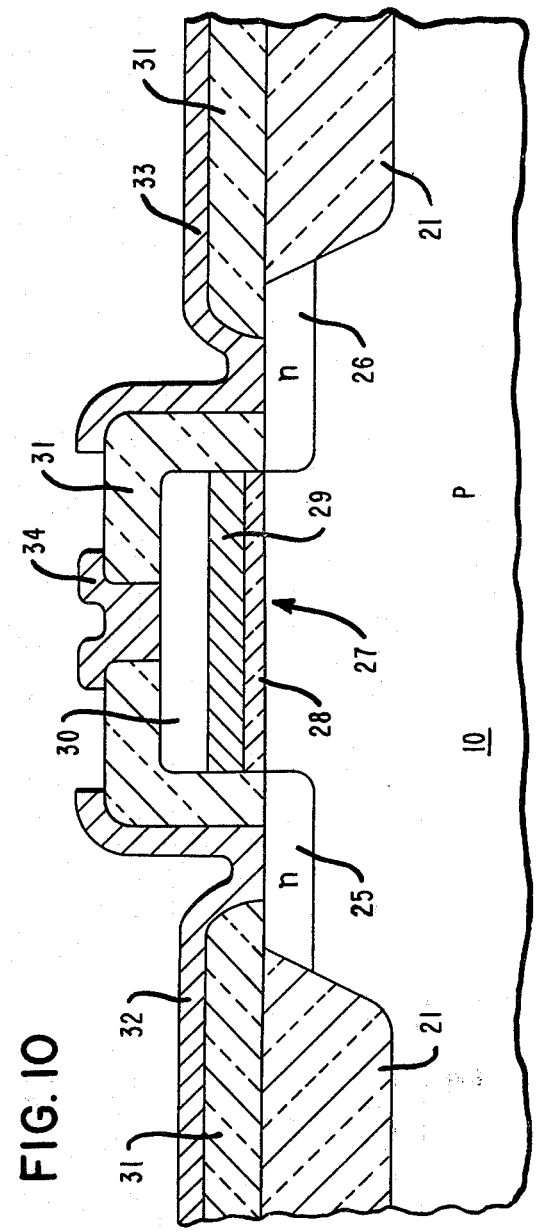
FIG. 10 is a cross-sectional representation of a true coplanar structure fabricated in accordance with the present invention showing a conventional integrated circuit formed thereon.

One such completed device of the MNOS type formed on a true coplanar structure of the present invention is shown in FIG. 10. In this Figure, the silicon substrate 10 is of p-type. A source 25 and a drain 26 having n-type impurities are formed in the substrate 10 defining a channel region 27 therebetween. On the channel region 27, a first insulating layer 28 made of, for example, silicon dioxide, a second insulating layer 29 made of, for example, silicon nitride, and a control gate 30 made of, for example, polycrystalline silicon, are formed in order such that the resulting gate structure is in a self-aligned relationship with the source 25 and drain 26. Reference numeral 31 indicates an insulating layer made of, for example, phosphosilicate glass for electrically isolating the metal (typically, aluminum) connections 32, 33 and 34 electrically connected to the source 25, drain 26 and the control gate 30, respectively. After a number of such devices are formed, they may be interconnected by conventional integrated circuit metallization subsequently formed on the surface of the semiconductor structure. The interconnections, because of the reduced bird's head and the true coplanar nature of the structure resulting from this invention will not be subjected to the previously-mentioned problems. Also, because of the remarkable reduction in bird's beak and the consequent more precise isolation of adjacent devices, the device packing density is increased.

While this invention has been described with reference to illustrative embodiments, this description is not to be construed in a limiting sense. Various modifications of the illustrated embodiments, as well as other embodiments of the invention, will be apparent to persons skilled in the art upon reference to this description. It is therefore contemplated that the appended claims will cover any such modifications or embodiments as fall within the true scope and spirit of this invention.

I claim:

1. A process for forming a recessed oxide region in a portion of a semiconductor substrate comprising:
    forming a silicon oxide layer on a surface of said substrate and a silicon nitride layer on a portion of said oxide layer and having edges defining an active area of the substrate;
    forming a mask on said nitride layer having at least one edge projecting a predetermined distance beyond the nitride layer;
    forming a layer of dopant in said substrate, the edge of said dopant layer being positioned relative to an edge of the nitride layer by said projecting edge of the mask; and
    thermally oxidizing the substrate at a relatively low temperature of below approximately 800° C. converting the dopant layer to an oxide region laterally outside said nitride layer.

2. The process of claim 1, wherein the mask is a photoresist material and the step of forming the photoresist comprises:
    forming a photoresist layer having edges on the nitride; and
    etching the nitride such that at least one edge of said photoresist projects beyond the nitride the predetermined distance.

3. The process as recited in claim 1, wherein the step of forming the layer of dopant comprises:
    implanting ions of relatively high energy in said substrate such that said mask projecting edge protects from doping the substrate directly underneath the mask projecting edge;
    removing the mask; and
    diffusing the ions into the substrate to a predetermined lateral distance beneath the projecting edge of said mask.

4. The process of claim 3, wherein said ions are either arsenic or phosphorus and said high energy is in the range of about 80-100 kev.

5. The process of claims 1, 2, 3, or 4, further comprising:
    etching said oxide region such that at least one edge of the nitride layer projects a predetermined distance beyond the oxide layer;
    forming a second layer of dopant in said substrate, the edge of said second dopant layer being positioned relative to an edge of the oxide layer by said projecting edge of said nitride layer; and
    thermally oxidizing the substrate at a relatively low temperature of below approximately 800° C. to form an oxide region laterally outside said nitride layer and set completely below the substrate surface.

6. The process of claims 1, 2, 3 or 4, further comprising:
   etching said oxide region such that at least one edge of the nitride layer projects beyond the oxide layer a predetermined length;
   implanting ions of a relatively low energy in said substrate forming a second dopant layer in the substrate such that said nitride projecting edge protects from doping the substrate directly underneath the nitride projecting edge;
   diffusing the low energy ions into the substrate to a predetermined lateral distance beneath the projecting edge of said nitride; and
   thermally oxidizing the substrate at a relatively low temperature of about 700°–800° C. to form the recessed oxide region laterally outside said nitride layer, said recessed oxide being sunk from said substrate surface.

7. The process of claims 1, 2, 3 or 4 further comprising:
   etching said oxide region such that at least one edge of the nitride layer projects beyond the oxide layer a predetermined length;
   implanting ions of energy in the range (30–50) kev in said substrate forming a second dopant layer in the substrate such that said nitride projecting edge protects from doping the substrate directly underneath the nitride projecting edge;
   diffusing said 30–50 kev energy ions into the substrate to a predetermined lateral distance beneath the projecting edge of said nitride; and
   thermally oxidizing the substrate at a relatively low temperature of about 700°–800° C. to form the recessed oxide region laterally outside said nitride layer, said recessed oxide being sunk from said substrate surface.

8. The process of claims 1, 2, 3 or 4, wherein the step of thermally oxidizing the substrate is applied for sufficient time to convert an upper portion of the dopant layer to an oxide region laterally outside said nitride layer leaving intact a lower portion of the dopant layer in said substrate the process further comprising:
   removing said oxide region and exposing said lower portion of the dopant layer in the substrate; and
   thermally oxidizing the substrate at a relatively low temperature of about 700°–800° C. completely converting the lower portion of the dopant layer into the recessed oxide region laterally outside said nitride layer said recessed oxide region being sunk from said substrate surface.

9. The process of claims 1, 2, 3 or 4 further comprising:
   etching the oxide region laterally outside said nitride layer forming a recess in the substrate corresponding to said oxide region; and
   thermally oxidizing at a relatively high temperature of above approximately 1000° C. to form a recessed oxide region in said recess, said recessed oxide region being sunk from said substrate surface.

10. In an improved local oxidation of silicon (LOCOS) field oxide process for forming an integrated circuit structure, the improved process comprising the steps of:
    forming a silicon dioxide layer on a surface of said substrate, a silicon nitride layer on said silicon dioxide layer and a photoresist mask having edges on the nitride;
    etching the nitride such that at least one edge of said photoresist projects beyond the nitride a predetermined distance;
    implanting ions of a relatively high energy in said substrate forming a dopant layer in the substrate such that the photoresist projecting edge protects from doping the substrate directly underneath the projecting edge;
    removing the photoresist mask;
    diffusing the relatively high energy ions into the substrate to a predetermined lateral distance beneath said projecting edge of the photoresist mask; and
    thermally oxidizing the substrate at a relatively low temperature converting the first dopant layer to an oxide region laterally outside said nitride.

11. In an improved local oxidation of silicon field oxide (LOCOS) process for forming an integrated circuit structure, the improved process comprising the steps of:
    forming a silicon dioxide layer on a surface of said substrate, a silicon nitride layer on said silicon dioxide layer and a photoresist mask having edges on the nitride;
    etching the nitride such that at least one edge of said photoresist projects beyond the nitride a predetermined distance;
    implanting ions of a relatively high energy in said substrate forming a first dopant layer in the substrate such that the photoresist projecting edge protects from doping the substrate directly underneath the photoresist projecting edge;
    removing the photoresist mask;
    diffusing the relatively high energy ions into the substrate to a predetermined lateral distance beneath said edge of the photoresist mask;
    thermally oxidizing the substrate at a relatively low temperature converting the first dopant layer to an oxide region laterally outside said nitride;
    etching said oxide region such that at least one edge of the nitride projects beyond the oxide layer a predetermined distance;
    implanting ions at a relatively low energy in said substrate forming a second dopant layer in the substrate such that the nitride projecting edge protects from doping the substrate directly underneath the nitride projecting edge;
    diffusing the low energy ions into the substrate to a predetermined lateral distance beneath the projecting edge of the nitride; and
    thermally oxidizing the substrate at a relatively low temperature converting the second dopant layer to a recessed oxide region laterally outside said nitride layer, said recessed oxide region being sunk from said substrate surface.

12. In an improved local oxidation of silicon field oxide (LOCOS) process for forming an integrated circuit structure, the improved process comprising the steps of:
    forming a silicon dioxide layer on a surface of said substrate, a silicon nitride on said silicon dioxide layer, and a photoresist mask having edges on the nitride;
    etching the nitride such that at least one edge of said photoresist projects beyond the nitride a predetermined distance;

implanting ions of a relatively high energy in said substrate forming a dopant layer in the substrate such that the photoresist projecting edge protects from doping the substrate directly underneath the photoresist projecting edge;

removing the photoresist mask;

diffusing the relatively high energy ions into the substrate to a predetermined lateral distance beneath said projecting edge of the photoresist;

thermally oxidizing the substrate at a relatively low temperature converting an upper portion of the first dopant layer into an oxide region laterally outside said nitride leaving intact a lower portion of the dopant layer in said substrate;

etching said oxide region and exposing said lower portion of the dopant layer; and thermally oxidizing the substrate at a relatively low temperature completely converting the lower portion of the dopant layer into the recessed oxide region laterally outside said nitride layer, said recessed oxide being sunk from said substrate surface.

13. In an improved local oxidation of silicon field oxide (LOCOS) process for forming an integrated circuit structure the improved process comprising the steps of:

forming a silicon dioxide layer on a surface of said substrate, a silicon nitride layer on said silicon dioxide layer and a photoresist mask having edges on the nitride;

etching the nitride such that at least one edge of said photoresist projects beyond the nitride a predetermined distance;

implanting ions of a relatively high energy in said substrate forming a dopant layer in the substrate such that the photoresist projecting edge protects from doping the substrate directly underneath the photoresist projecting edge;

removing the photoresist mask;

diffusing the relatively high energy ions into the substrate to a predetermined lateral distance beneath said projecting edge of the photoresist mask;

thermally oxidizing the substrate at a relatively low temperature converting the dopant layer to an oxide region laterally outside said nitride;

etching said oxide region laterally outside said nitride forming a recess in the substrate corresponding to said oxide region; and thermally oxidizing the substrate at a relatively high temperature to form a recessed oxide region in said recess, said recessed oxide region being sunk from said substrate surface.

14. The process of claims 10, 11, 12, or 13 wherein: said ions are either arsenic or phosphorus; said high energy is in the range 80–100 kev; said low energy is in the range 30–50 kev; said low temperature is in the range 700°–800° C.; and said high temperature is in the range 1000°–1100° C.

* * * * *